(12) United States Patent
Watanabe et al.

(10) Patent No.: US 6,469,255 B2
(45) Date of Patent: Oct. 22, 2002

(54) COMPOSITE WIRING BOARD AND MANUFACTURING METHOD THEREOF

(75) Inventors: Yoshio Watanabe, Kanagawa; Toru Takebe, Tokyo; Mayumi Kosemura, Kanagawa, all of (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/855,771

(22) Filed: May 16, 2001

(65) Prior Publication Data

US 2002/0006503 A1 Jan. 17, 2002

(30) Foreign Application Priority Data

May 17, 2000 (JP) ......................................... 2000-149843

(51) Int. Cl.7 ................................................ H05K 1/00
(52) U.S. Cl. ...................... 174/254; 174/261; 439/59; 439/61; 439/62; 439/67; 439/78; 439/83; 439/289; 361/749; 361/765; 361/776
(58) Field of Search .............................. 439/59, 61, 62, 439/74, 78, 83, 289, 67; 174/254, 255, 250, 261; 361/749, 765, 776

(56) References Cited

U.S. PATENT DOCUMENTS

| | | | | |
|---|---|---|---|---|
| 3,362,005 | A | * | 1/1968 | Corns |
| 4,113,981 | A | * | 9/1978 | Fujita et al. ................. 174/257 |
| 5,005,105 | A | * | 4/1991 | Onodera ...................... 361/748 |
| 5,346,401 | A | * | 9/1994 | Delianides et al. ............ 439/67 |
| 5,428,190 | A | * | 6/1995 | Stopperan .................... 174/254 |
| 5,737,053 | A | * | 4/1998 | Yomogihara et al. ........ 361/749 |
| 6,040,529 | A | * | 3/2000 | Takeshita et al. ............ 174/254 |
| 6,195,261 | B1 | * | 2/2001 | Babutzka et al. ............ 361/752 |
| 6,274,225 | B1 | * | 8/2001 | Miyake et al. ............... 428/209 |

\* cited by examiner

*Primary Examiner*—Cathy Lam
(74) *Attorney, Agent, or Firm*—Ronald P. Kananen, Esq.; Rader, Fishman, & Grauer, PLLC.

(57) ABSTRACT

There is provided a composite wiring board that occupies a small space and is low in price and a manufacturing method thereof; the composite wiring board comprises at least two rigid wiring boards on end faces of which connection portions are formed, in which each of the rigid wiring boards is arranged so that each of the connection portions is situated on a plane and each of corresponding connection portions is connected with each other in the plane.

25 Claims, 4 Drawing Sheets

COMPOSITE WIRING BOARD AND MANUFACTURING METHOD THEREOF

BACKGROUND OF THE INVENTION

1. Field of the Invention

The present invention relates to a composite wiring board in which at least two rigid wiring boards are joined and a manufacturing method thereof.

2. Description of the Related Art

Conventionally, a composite wiring board in which at least two rigid wiring boards are disposed substantially in parallel to each other and are joined to each other for attaining to be small in size and excellent in function has been used.

FIG. 1A is a side view showing a first example of the conventional composite wiring board.

The composite wiring board 10 has a structure that connectors 13, 14 are respectively mounted on two rigid wiring boards 11, 12 and a lead wire or a flexible wiring board 15 are inserted into each of the connectors 13, 14 to join each of the rigid wiring board 11, 12.

Because the connectors 13, 14 need to have a height and an area to a certain extent owing to the necessity of a pitch of a connector pin or other necessities, the composite wiring board 10 having the aforesaid structure has a fault that it is not suitable for high density mounting.

FIG. 1B is a side view showing a second example of the conventional composite wiring board.

The composite wiring board 20 has a structure that counterparts 23, 24 of a board-to-board connector capable of being divided into the two counterparts 23, 24 are mounted on two rigid wiring boards 21, 22, respectively, and that the counterparts 23, 24 of the board-to-board connector are fit to each other and thereby each of the rigid wiring boards 21, 22 is joined to each other.

The composite wiring board 20 having such a structure does not need any lead wires and thereby does not require any troubles of the connection of the two rigid wiring boards 21, 22. However, because the composite wiring board 20 has the structure formed by the simple pressing to each other of the counter parts 23, 24 of the board-to-board connector for joining them, the composite wiring board 20 has a disadvantage that the counterparts 23, 24 of the board-to-board connector are easy to come off owing to vibrations and other forces at the time of the usage thereof.

FIG. 1C is a side view showing a third example of the conventional composite wiring board.

The composite wiring board 30 has a structure that a lead wire or a flexible wiring board 33 is directly soldered on two rigid wiring boards 31, 32 for joining each of the rigid wiring boards 31, 32.

The composite wiring board 30 having such a structure becomes less expensive in costs because it does not have the aforesaid connectors 13, 14, 23 and 24, but it has a disadvantage that it is not suitable for high density mounting because It has a necessity of widening the pitches of the circuit patterns on the rigid wiring boards 31, 32 for preventing the bridging of solder.

FIG. 1D is a side view showing a fourth example of the conventional composite wiring board.

The composite wiring board 40 is a flex rigid wiring board that has a structure using two rigid wiring boards 41. 42 that put a flexible wiring board 43 at the center part of each of them.

Because the flexible wiring board 43 is put in each of the rigid wiring boards 41, 42 in the composite wiring board 40 having such a structure, the joining of each of the rigid wiring boards 41, 42 is strong. Moreover, because the decrease of the mounting area is not produced like in each of the aforesaid composite wiring boards 10, 20 and 30, the composite wiring board 40 is suitable for high-density mounting.

Because it is needed for the aforesaid fourth example of the conventional composite wiring board 40 to put and fix the flexible wiring board 43 having flexibility between the rigid wiring boards 41, 42, a specific adhesive is needed, and the gluing processes thereof are complicated, and further the coefficient of utilization of the material is also decreases. Consequently, the composite wiring board 40 has a disadvantage that it becomes very expensive. Moreover, because the composite wiring board 40 has a necessity to bend the flexible wiring board 43 between the rigid wiring boards 41 and 42, the composite wiring board 40 has another disadvantage that it needs a space for the bending.

SUMMARY OF THE INVENTION

Accordingly, an object of the present invention is to solve the aforementioned problems and to provide a composite wiring board that occupies a small space and is low in price and a manufacturing method thereof.

According to the present invention, the foregoing and other objects and advantages are attained by a composite wiring board comprising at least two rigid wiring boards on an end face of each of which a connection portion is formed, wherein each of the rigid wiring boards is arranged so that each of the connection portions is situated on a plane and each of the corresponding connection portions is connected with each other in the plane.

Because the connection portions are formed on the end faces of the rigid wiring boards according to the aforesaid structure of the invention, the plural rigid wiring boards can be Joined by the connection of each of the corresponding connection portions at the side face of each of the rigid wiring boards. Consequently, existing connection means can be applied to the connection of each of the connection portions, and thereby the composite wiring board can be manufactured inexpensively in cost. Moreover, because the connection means can be arranged in one plane, it is possible to attain the decrease of the space of the composite wiring board.

As described above, according to the invention, a composite wiring board that is inexpensive and occupies a small space can be provided.

BRIEF DESCRIPTION OF THE DRAWINGS

The above and other objects, features and advantages of the present invention will become more apparent from the following description of the presently preferred exemplary embodiments of the invention taken in conjunction with the accompanying drawings, in which.

DESCRIPTION OF THE PREFERRED EMBODIMENTS

Hereinafter, a preferable embodiment of the present invention will be described in detail on the basis of the attached drawings.

Incidentally, the following embodiment includes various technically preferable limitations because the embodiment is a suitable concrete example of the present invention. However the scope of the present invention is not limited to the forms except a case where a specific mention of the limitation of the invention to the described form is made in the following description.

FIGS. 2A–2F, 3A–3F and FIGS. 4A, 4B are process drawings and perspective views, respectively, showing an embodiment of a method for manufacturing a composite wiring board of the present invention. The method will be described by reference to each of the drawings.

Figure 1A:
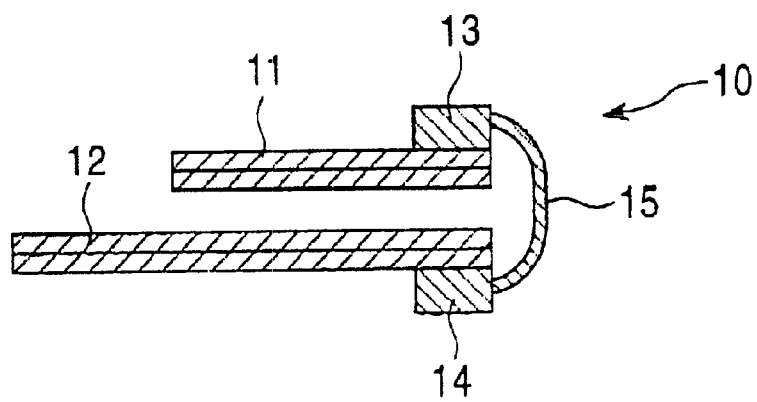
FIGS. 1A–1D are side view showing conventional composite wiring boards.
Figure 1B:
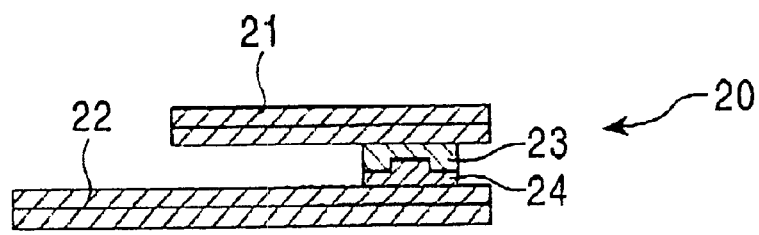
Figure 1C:
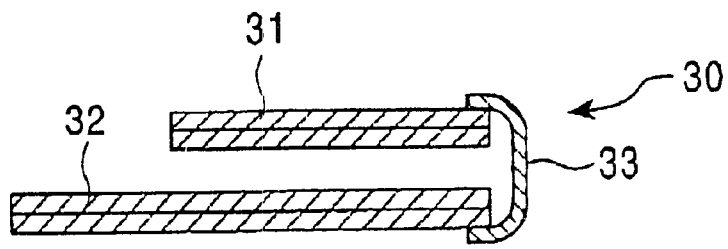
Figure 1D:
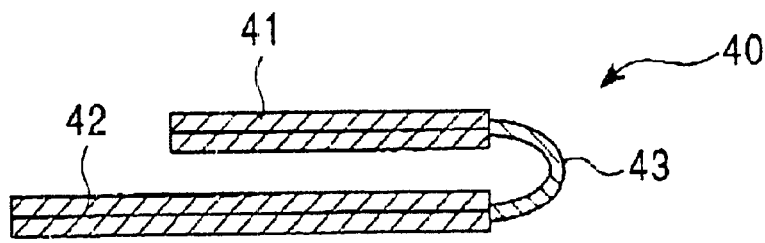
Figure 2A:
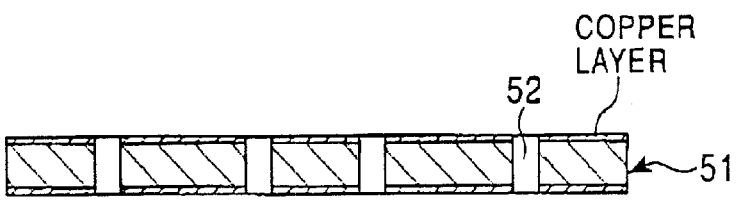
FIGS. 2A–2F are first process drawings showing a part of an embodiment of a method for manufacturing a composite wiring board of the present invention.
Figure 2B:
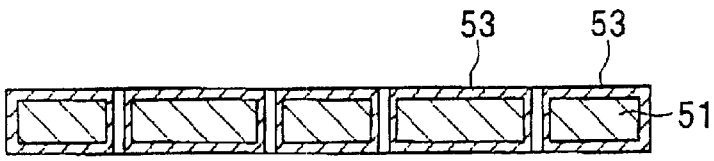

At first, through holes to be interstitial blind via holes 52 are drilled in a double-sided copper-clad laminate 51 (FIG. 2A), and copper plating is performed on both surfaces of the double-sided copper-clad laminate 51 and inner surfaces of the interstitial blind via holes 52 to form a copper foil 53 (FIG. 2B).

Figure 2C:
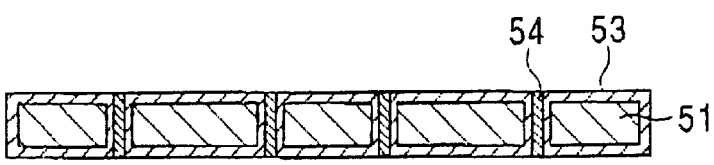

Then, copper paste 54 is embedded in prescribed interstitial blind via holes 52, and both of the surfaces of the double-sided copper-clad laminate 51 including the end faces of the copper paste 54 are polished (FIG. 2C). Incidentally, any conductive material such as solder may be used instead of the copper paste 54.

Figure 2D:
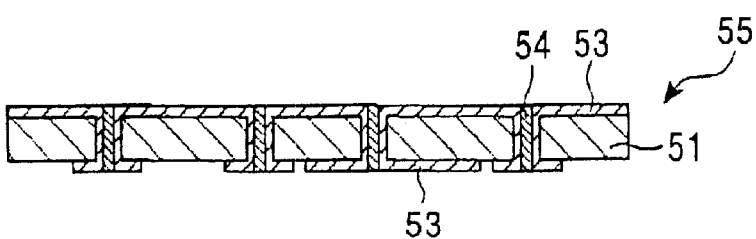

Next, the copper foil 53 on one surface of the double-sided copper-clad laminate 51 is etched, and a prescribed inner layer pattern is formed to be a first layer wiring board 55 (FIG. 2D). At this time, wirings to be used for the connection between rigid wiring boards 63 and 65, which will be described later, are formed up to the end of the first layer wiring board 55, although they are not shown in the figure.

Figure 2E:
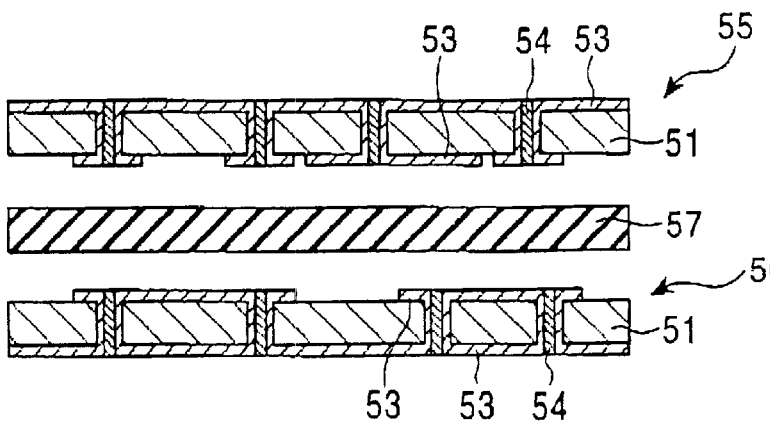
Figure 2F:
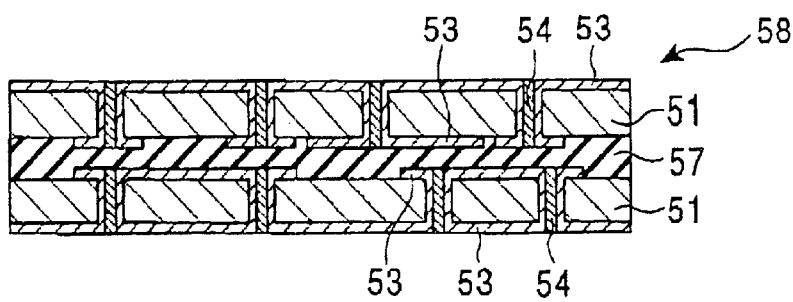
Figure 3A:
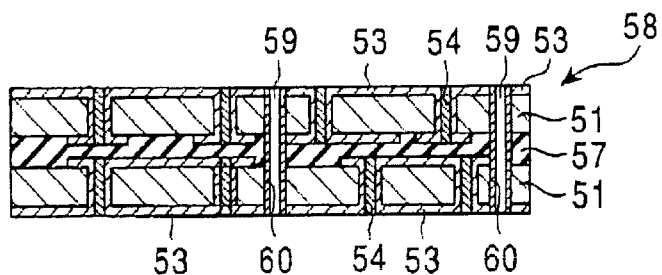
FIGS. 3A–3F are second process drawings showing another part of the embodiment of the method for manufacturing the composite wiring board of the invention.
Figure 3B:
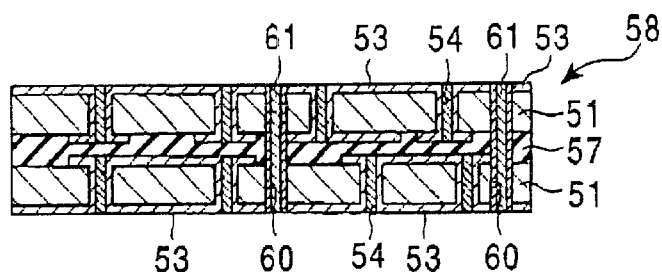

Then, a second layer wiring board 56 is manufactured In conformity with the processes similar to those described above. The patterned surface of each of the wiring boards 55, 56 is opposed to each other with a prepreg 57 put between them (FIG. 2E). Then, each of the wiring boards 55, 56 and the prepreg 57 is bonded by the thermo-compression bonding by being heated under pressure from the outer side surface of each of them to be formed as a laminated wiring board 58 (FIG. 2F). Through holes to be formed as through holes 59, are drilled in the laminated wiring board 58. Copper plating is performed to the inner surfaces of the through holes 59 to form a copper foil 60 (FIG. 3A), and copper paste 61 is embedded in prescribed through holes 59 (FIG. 3B). Incidentally, any conductive material such as solder may be used instead of the copper paste 61.

Figure 3C:
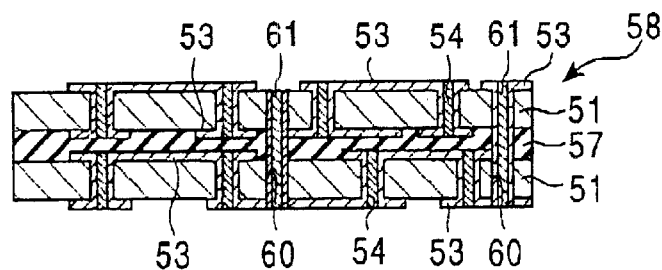
Figure 3D:
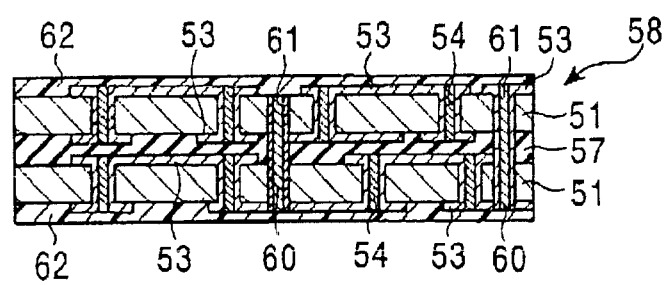
Figure 3E:
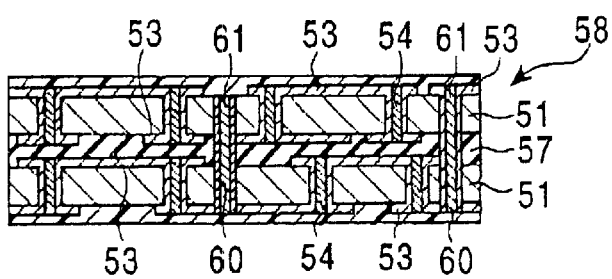

Next, after the upper surfaces of the copper foils 53 on both of the surfaces of the laminated wiring board 58 including the end faces of the copper paste 61 have been polished, the copper foils 53 on both of the surfaces of the laminated wiring board 58 are etched to form prescribed outer layer patterns (FIG. 3C). In this case also, the wirings to be used for the connection between the rigid wiring boards 63 and 65, which will be described later, are formed up to the end of the laminated wiring board 58, although they are not shown in the figure. Then, solder resist 62 is applied on the outer layer patterns (FIG. 3D), and the laminated wiring board 58 is cut with a rooter or punched out by a pressing machine to be a four-layer rigid wiring board 63 having a predetermined outer shape (FIG. 3E).

Figure 3F:
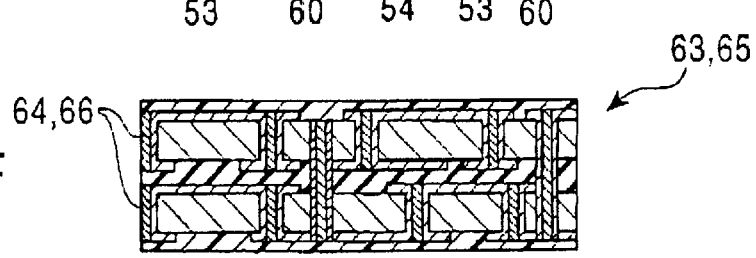

Next, the end face of the rigid wiring board 63 is cut with a dicer, a rooter or a rotary cutter, and connection portions 64 that are ends of the wirings to be used for the connection of the rigid wiring board 63 are formed on the cut end face (FIG. 3F). Then, a rigid wiring board 65, on an end face for the joining with the aforesaid rigid wiring board 63 of which connection portions 66 are formed, is manufactured in conformity with the processes similar to those described above.

Figure 4A:
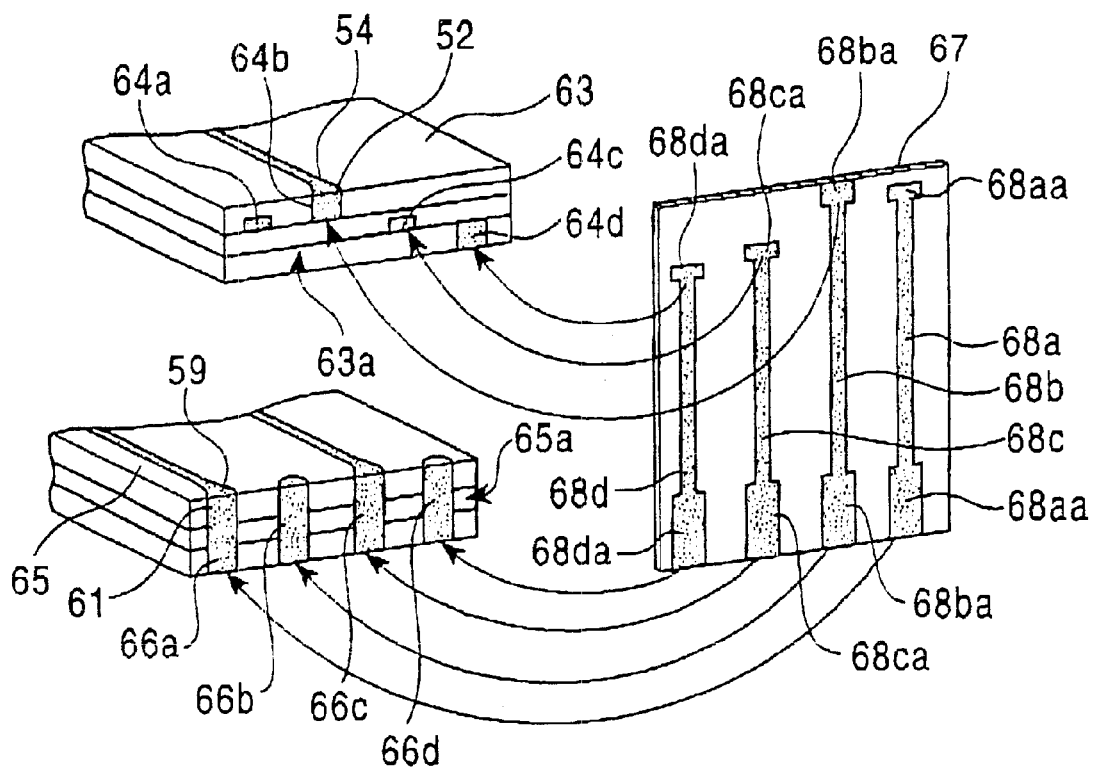
FIGS. 4A and 4B are perspective views showing a further part of the embodiment of the method for manufacturing the composite wiring board of the invention.

That is, for example, as shown in FIG. 4A, connection portions 64a, 64c and 64b, 64d are formed on an end face 63a of the rigid wiring board 63 by cutting a wiring part or one of the interstitial blind via holes 52 in which copper paste 54 is embedded. And, connection portions 66a, 66b, 66c and 66d are formed on an end face 65a of the rigid wiring board 65 by cutting one of the through holes 59 in which the copper paste 61 is embedded.

It is desirable to form the width of the wiring part thick to improve the reliability of connection by the setting of the areas of the connection portions formed by cutting the wiring part to be as large as possible. Moreover, the end faces of the rigid wiring boards 63 and 65 may be cut obliquely for the decrease of loads at the connection parts together with the increase of the areas of the connection portions as large as possible for the increase of the reliability. Moreover, because the connection portions formed by cutting the interstitial blind via holes 52 or the through holes 59 become hollow parts to decrease the reliability of connection, it is desirable to embed a conductive material such as copper paste and solder for preventing the formation of the hollow parts.

Then, each of the rigid wiring boards 63, 65 are arranged in parallel to each other and the end faces 63a, 65a are arranged to be flush with each other. That is, each of the rigid wiring boards 63, 65 are arranged so that each of the connection portions 64a, 64b, 64c, 64d, 66a, 66b, 66c and 66d are situated on a plane.

Next, a flexible wiring board 67 on which leads 68a, 68b, 68c and 68d are formed for connecting corresponding connection portions on each of the rigid wiring boards 63, 65, namely connection portions 64a and 66a, 64b and 66b, 64c and 66c, and 64d and 66d in the present example, is manufactured.

Figure 4B:
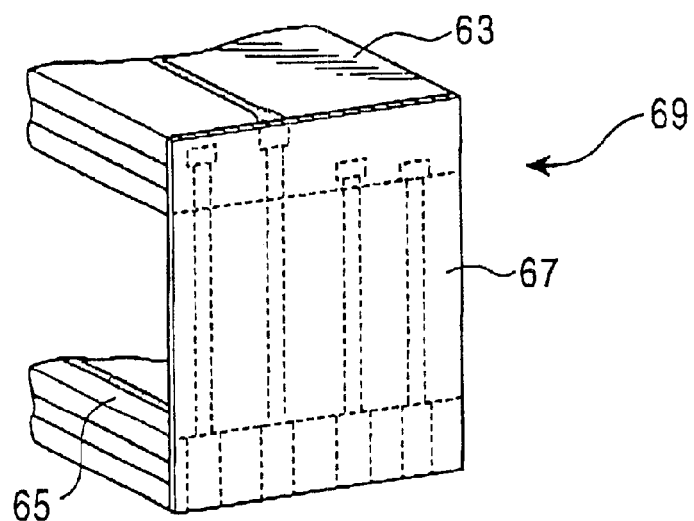

Then, as shown in FIG. 4B, the flexible wiring board 67 is pasted to the end faces 63a, 65a of each of the rigid wiring boards 63, 65 in a state of being held to be flat, and the corresponding connection portions 64a and 66a, 64b and 66b, 64c and 66c, and 64d and 66d are connected to each other with the leads 68a, 68b, 68c and 68d, respectively. Then, the composite wiring board 69 is completed. Incidentally, lead wires may used for connecting the corresponding connection portions 64a and 66a, 64b and 66b, 64c and 66c, and 64d and 66d in place of the flexible wiring board 67.

Now, the reliability of the connection of each of the leads 68a, 68b, 68c and 68d of the flexible wiring board 67 or the lead wires with each of the connection portions 64a, 64b, 64c, 64d, 66a, 66b, 66c and 66d can be increased by the formation of bumps 68aa, 68ba, 66ca and 68da on both of the ends of each of the leads 68a, 68b, 68c and 68d or the lead wires in advance.

There are the following three methods as the connection methods of the aforesaid connection portions 64a, 64b, 64c, 64d, 66a, 66b, 66c and 66d with the leads 68a, 68b, 68c and 68d or the lead wires. That is, the methods are: a method in which a resin paste or a resin film is applied to the connection portions 64a, 64b, 64c, 64d, 66a, 66b, 66c and 66d and the flexible wiring board 67 or the lead wires are connected with the connection portions 64a, 64b, 64c, 64d, 66a, 66b, 66c and 66d by heating and pressuring, or by exciting by ultrasonic waves; a method in which a high voltage is imposed on the lands on the upper surfaces of the rigid wiring boards 63, 65 and the flexible wiring board 67 or the lead wires to join them; and a method in which solder is heated to be fused for Joining.

Because in the aforesaid composite wiring board 69 the flexible wiring board 67 and other connection members for joining are prepared as separated members and join the rigid wiring boards 63 and 65 in a state of being flat, the costs of the manufacture of it can be decreased and the space for the composite wiring board 69 can be decreased. Moreover, because the area for mounting connectors or other connecting members becomes unnecessary, the area for the mounting of parts can be used most effectively. Moreover, because the rigid wiring boards can be connected only by the drawing out of the wiring for connection to their side faces, the extra via holes and through holes become unnecessary and the high density mounting of the parts becomes possible.

What is claimed is:

1. A composite wiring board comprising:
   at least two rigid wiring boards on an end face of each of which a connection portion is formed, wherein each of said rigid wiring boards is arranged so that each of the connection portions is situated on a plane and each of corresponding connection portions is connected with each other in the plane,
   wherein each of the corresponding connection portions is connected with each other with a lead formed on at least one flexible wiring board put between the corresponding connection portions in a state that the flexible wiring board is held to be flat.

2. The composite wiring board according to claim 1, wherein each of the corresponding connection portions is connected to each other with a lead wire put between them.

3. The composite wiring board according to claim 1, wherein each of the connection portions is formed by cutting a hole formed at an end of each of said rigid wiring boards.

4. The composite wiring board according to claim 3, wherein a conductive material is embedded in the hole.

5. The composite wiring board according to claim 1, wherein the end face of each of said rigid wiring boards on which each of the connection portions is formed as an inclined plane.

6. A method for manufacturing a composite wiring board in which at least two rigid wiring boards are joined, said method comprising the steps of:
   forming a wiring for connecting each of said rigid wiring boards to each other up to each end of said rigid wiring boards:
   forming a connection portion on an end face formed by cutting each of the ends of said rigid wiring boards on which said wiring is formed;
   arranging each of said rigid wiring boards so that each of said connection portions is situated in a plane; and
   connecting each corresponding connection portion in the plane wherein each of the corresponding connection portions is connected with each other with a lead formed on an at least one flexible wiring board put between the corresponding connection portions of said two rigid wiring boards in a state that the flexible wiring board is held to be flat.

7. The method according to claim 6, wherein each of the corresponding connection portions is connected to each other with a lead wire put therebetween.

8. The method according to claim 6, wherein each of the connection portions is formed by cutting a hole formed at an end of each of said rigid wiring boards so as to be connected with said wiring for connecting.

9. The method according to claim 8, wherein a conductive material is embedded in the hole.

10. The method according to claim 6, wherein the end face of each of said rigid wiring boards is formed as an inclined plane by being cut obliquely.

11. A composite wiring board comprising:
    a plurality of circuit boards and a coupling board,
    a first circuit board of plurality of circuit boards having
       at least one first circuit connection portion, a first circuit top surface, a first circuit bottom surface and
       a first circuit side surface,
          said first circuit top surface being adjacent and in contact with said first circuit side surface,
          said first circuit bottom surface being adjacent and in contact with said first circuit side surface,
          said first circuit top surface opposing said first circuit bottom surface,
          said at least one first circuit connection portion being exposed on said first circuit side surface,
    a second circuit board of plurality of circuit boards having
       at least one second circuit connection portion, a second circuit top surface, a second circuit bottom surface and a second circuit side surface,
          said second circuit top surface being adjacent and in contact with said second circuit side surface,
          said second circuit bottom surface being adjacent and in contact with said second circuit side surface,
          said second circuit top surface opposing said second circuit bottom surface,
          said at least one second circuit connection portion being exposed on said second circuit side surface,
    said coupling board having at least one coupling connection portion, a coupling top surface, and a coupling bottom surface,
       said coupling top surface opposing said coupling circuit bottom surface,
       said at least one coupling connection portion being disposed on said coupling top surface,
       said at least one coupling connection portion being in contact with said at least one first circuit connection portion and said at least one second circuit connection portion.

12. The composite wiring board according to claim 11, wherein:
    at least two rigid wiring boards are on a lateral surface of each of which a connection portion is formed, and wherein each of said rigid wiring boards is arranged so that each of the connection portions is situated on a plane and each of corresponding connection portions is connected with each other in the plane,
    said at least two rigid wiring boards being said plurality of circuit boards.

13. The composite wiring board according to claim 11, wherein said coupling top surface is in contact with said first circuit side surface, and said coupling bottom surface is in contact with said second circuit side surface.

14. The composite wiring board according to claim 11, wherein said at least one first circuit connection portion is exposed on a face of said first circuit side surface.

15. The composite wiring board according to claim 11, wherein said at least one second circuit connection portion is exposed on a face of said second circuit side surface.

16. The composite wiring board according to claim 11, wherein said at least one first circuit connection portion is coplanar with said at least one second circuit connection portion.

17. The composite wiring board according to claim 11, wherein said first circuit board includes a first upper wire board, a first lower wire board and a first prepreg layer, said first prepreg layer being between said first upper wire board and said first lower wire board.

18. The composite wiring board according to claim 11, wherein said second circuit board includes an second upper wire board, a second lower wire board and a second prepreg layer, said second prepreg layer being between said second upper wire board and said second lower wire board.

19. The composite wiring board according to claim 11, wherein said at least one first circuit connection portion is formed from a conductive material.

20. The composite wiring board according to claim 11, wherein said at least one second circuit connection portion is formed from a conductive material.

21. The composite wiring board according to claim 11, wherein said at least one coupling connection portion is formed from a conductive material.

22. The composite wiring board according to claim 11, wherein said first circuit bottom surface opposes said second circuit top surface.

23. The composite wiring board according to claim 11, wherein said first circuit board is substantially parallel with said second circuit board.

24. The composite wiring board according to claim 11, wherein said first circuit board is parallel with said second circuit board.

25. The composite wiring board according to claim 11, wherein said at least one coupling connection portion is a plurality of coupling connection portions, said at least one first circuit connection portion is a plurality of first connection portions, and said at least one second circuit connection portion is a plurality of second connection portions.

* * * * *